United States Patent [19]
Mizutani et al.

[11] Patent Number: 5,488,251
[45] Date of Patent: Jan. 30, 1996

[54] SEMICONDUCTOR DEVICE AND PROCESS FOR PRODUCING THE SAME

[75] Inventors: Hidemasa Mizutani, Sagamihara; Shigeki Kondo, Hiratsuka, both of Japan

[73] Assignee: Canon Kabushiki Kaisha, Tokyo, Japan

[21] Appl. No.: 285,765

[22] Filed: Aug. 3, 1994

Related U.S. Application Data

[63] Continuation of Ser. No. 150,247, Nov. 9, 1993, abandoned, which is a continuation of Ser. No. 824,573, Jan. 23, 1992, abandoned, which is a division of Ser. No. 501,968, Mar. 29, 1990, Pat. No. 5,106,765, which is a continuation of Ser. No. 358,515, May 30, 1989, abandoned, which is a continuation of Ser. No. 240,485, Sep. 6, 1988, abandoned, which is a continuation of Ser. No. 18,457, Feb. 25, 1987, abandoned.

[30] Foreign Application Priority Data

Feb. 28, 1986 [JP] Japan ................... 61-044790
Feb. 28, 1986 [JP] Japan ................... 61-044791

[51] Int. Cl.[6] ................... H01L 27/14; H01L 27/02
[52] U.S. Cl. ................... 257/557; 257/432; 257/435
[58] Field of Search ................... 257/435, 432, 257/557

[56] References Cited

U.S. PATENT DOCUMENTS

| | | | |
|---|---|---|---|
| 4,034,395 | 7/1977 | Abdelrahman | 357/28 |
| 4,155,094 | 5/1979 | Ohba et al. | 357/30 |
| 4,486,942 | 12/1984 | Hirao | 437/59 |
| 4,621,275 | 11/1986 | Ueno et al. | 357/30 |
| 4,623,909 | 11/1986 | Nishigawa et al. | 357/30 |
| 4,635,087 | 1/1987 | Birrittella et al. | 357/38 |
| 4,637,125 | 1/1987 | Iwasaki et al. | 27/571 |
| 4,651,016 | 3/1987 | Hirao | 250/578 |
| 4,665,422 | 5/1987 | Hirao et al. | 357/30 |
| 4,672,221 | 6/1987 | Saito et al. | 250/578 |
| 4,684,970 | 8/1987 | Sloane et al. | 257/557 |
| 4,727,407 | 2/1988 | Nobue et al. | 257/435 |
| 4,743,955 | 5/1988 | Matsumoto | 357/30 |
| 4,752,589 | 6/1988 | Schaber | 437/31 |

FOREIGN PATENT DOCUMENTS

| | | |
|---|---|---|
| 0139266 | 5/1985 | European Pat. Off. . |
| 0226892 | 7/1987 | European Pat. Off. . |
| 3205022 | 9/1982 | Germany . |
| 3425908 | 8/1983 | Germany ............... H01L 27/141 |
| 56-61160 | 5/1981 | Japan . |
| 58-222556 | 12/1983 | Japan ............... H01L 27/06 |
| 59-96781 | 6/1984 | Japan ............... H01L 31/10 |
| 61-61457 | 3/1986 | Japan ............... H01L 27/14 |

Primary Examiner—Rolf Hille
Assistant Examiner—Valencia Martin Wallace
Attorney, Agent, or Firm—Fitzpatrick, Cella, Harper & Scinto

[57] ABSTRACT

A photosensor includes a semiconductor substrate of a first-conductivity type with a photoelectric conversion element such as photodiode thereon. The photodiode has a second, opposite conductivity and is surrounded at all of the bottom and sides by a domain having the second conductivity and a high impurity concentration. A first-conductivity domains forms a junction with the second-conductivity domain, and the photodiode is separated from other semiconductor elements by a first-conductivity domain.

8 Claims, 5 Drawing Sheets

SEMICONDUCTOR DEVICE AND PROCESS FOR PRODUCING THE SAME

This application is a continuation of application Ser. No. 08/150,247, filed Nov. 9, 1993, now abandoned, which was a continuation of application Ser. No. 07/824,573, filed Jan. 23, 1992, now abandoned, which was a division of application Ser. No. 07/501,968, filed Mar. 29, 1990, now U.S. Pat. No. 5,106,765, which was a continuation of application Ser. No. 07/358,515, filed May 30, 1989, now abandoned which was a continuation of application Ser. No. 07/240,485, filed Sep. 6, 1988, now abandoned which was a continuation of application Ser. No. 07/018,457, filed Feb. 25, 1987, now abandoned.

BACKGROUND OF THE INVENTION

1. Field of the Invention

The present invention relate to a semiconductor device, in particular a semiconductor device having a bipolar transistor and a gate-insulated transistor and/or a photodiode on a same substrate, and a process for producing said semiconductor device.

2. Related Background Art

There are already developed various composite IC's including both bipolar transistors and MOS transistors, but the transistors of such composite IC's are not satisfactory with respect to the dimension, electrical properties and reliability in comparison with those of simple IC's.

For improving the bipolar transistor in such a composite IC, there is proposed, in the Japanese Patent Laid-open 222556/1983 to form the emitter domain by an impurity diffusion from a polysilicon layer, thereby obtaining a shallow junction by self alignment.

On the other hand, miniaturized MOS transistors show certain drawbacks such as hot electron effect or short channel effect. LDD structure or offset gate structure with side walls is proposed as a countermeasure against such defects.

However such improvement is intended for either of the transistors, and the separate formation of these transistors will not only result in an increase in the number of process steps but also give rise to an undesirable mutual effect on both transistors.

There has been also proposed a composite photosensor IC containing a bipolar transistor and a photodiode. Such photosensor enables direct processing of the output of the photodiode. FIG. 1A shows an example of such IC, and FIG. 1B is a cross-sectional view along a line I—I in FIG. 1A.

Referring to FIGS. 1A and 1B, a photodiode PD and a bipolar transistor BI are formed on a P-semiconductor substrate 1, across a P$^+$-separating area 4. More specifically, on N$^+$-embedded layers 2, there are formed N-epitaxial layers 3 for constituting the N-domain of the photodiode and the collector domain of the transistor. There are further formed a P-domain 5 of the photodiode and a P-base domain 6 of the transistor on N$^+$ embedded layer 2. Furthermore, in the P-base domain 6 there is formed an N$^+$-emitter domain 7, and an N$^+$-layer 8 is simultaneously formed as an ohmic contact layer for the N-epitaxial layer 3.

The ohmic contact layer 8 does not reach the embedded layer 2 as shown in the drawing in one case of the configuration. While, in another case of the configuration not shown in the drawings, the layer 8 is directly connected to the embedded layer 2.

Such a photosensor is not affected by light because the bipolar transistor BI is provided thereon with an unrepresented light shield member, so that the parasitic transistor effect can be disregarded if the P-base domain 6 is separated from the separating area by 10 to 20 μm.

However the photodiode tends to show parasitic effect due to carrier formation by incident light, and requires a large margin for preventing such effect. Also the embedded layer 2 has to be much larger than the P-domain 5 in order to prevent the parasitic effect between the P-domain 5 and the substrate 1, and such structure results in an insufficient voltage resistance between the embedded layer 2 and the separating area 4.

SUMMARY OF THE INVENTION

An object of the present invention is to provide a semiconductor device having a bipolar transistor and a gate-insulated transistor and/or a photodiode on a same substrate, and allowing easy manufacture without defects in the performance.

Another object of the present invention is to provide a simplified process for producing a semiconductor device having a bipolar transistor and a gate-insulated transistor on a same substrate.

Still another object of the present invention is to provide a semiconductor device capable of suppressing the parasitic effect of photodiode by completely surrounding the photodiode with a semiconductor domain with a high impurity concentration of a conductive type opposite to that of the semiconductor substrate.

Still further object of the present invention is to provide method for producing a photosensor having a photodiode, a bipolar transistor and a insulating gate transistor, wherein respective constructional elements of the photosensor are formed on a common substrate in a single processing step.

DETAILED DESCRIPTION OF THE PREFERRED EMBODIMENTS

Now the present invention will be clarified in detail by embodiments thereof shown in the attached drawings.

FIGS. 2A to 2E illustrate an embodiment of the process for producing a semiconductor device of the present invention.

Figure 2A:
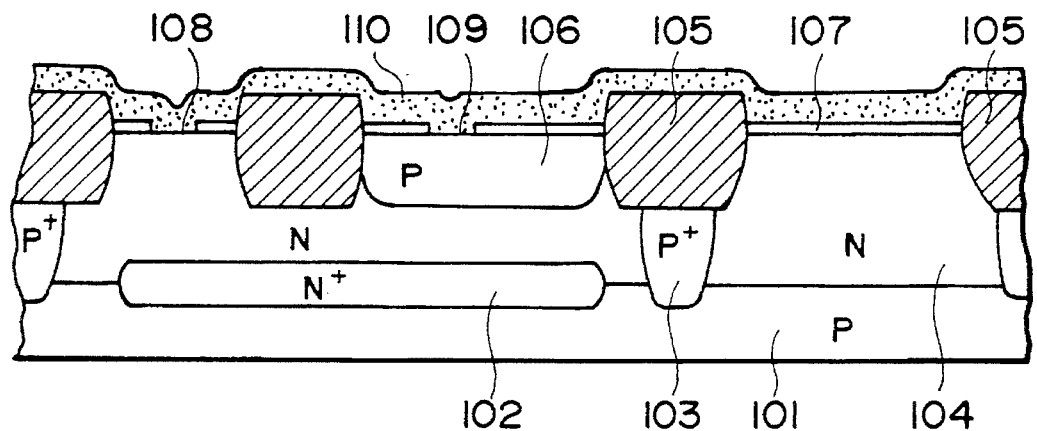
FIGS. 2A to 2E are views showing an embodiment of the process for producing the semiconductor device of the present invention.

At first, as shown in FIG. 2A, an N$^+$-embedded layer 102 and a P$^+$-embedded layer for developing P$^+$-separating domain 103 are formed on the surface of a P-silicon substrate 101, and an N-epitaxial layer 104 is developed. Subsequently a nitride layer is formed thereon, and is selectively etched off in an area for the separating area. A selectively oxidized layer 105 for element separation is formed by oxidation. Then a P-base domain 106 of a bipolar transistor is formed.

Then a gate oxide layer 107 of a thickness of 500 Å is formed on the N-epitaxial layer 104 and the P-base domain 106. Layer 107 is selectively removed by etching in areas for forming the collector and emitter domains of the bipolar transistor to obtain apertures 108, 109, of a size for example of 4×4 μm. Then a polysilicon layer 110 of a thickness of 5,000 Å is formed thereon and is doped with an N-type impurity such as P or As by ion implantation or with $POCl_3$. Naturally it is also possible to deposit doped polysilicon.

Figure 2B:
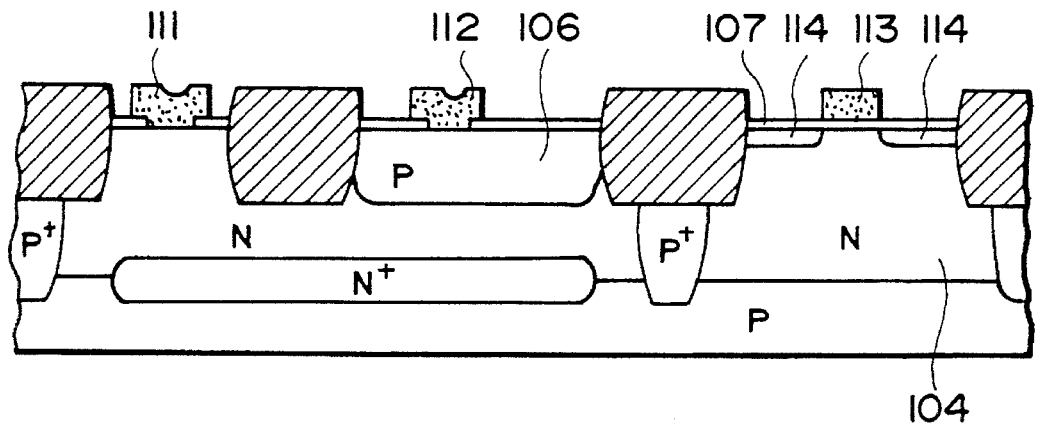

Subsequently, as shown in FIG. 2B, the polysilicon layer 110 is selectively removed by etching to obtain a collector diffusing polysilicon layer 111, an emitter diffusing polysilicon layer 112 and a gate electrode polysilicon layer 113, of a size of 6×6 μm. Then ions of a P-type impurity are implanted, utilizing the gate electrode polysilicon layer 113 to obtain an implanted domain 114 for forming the source and drain domains.

Figure 2C:
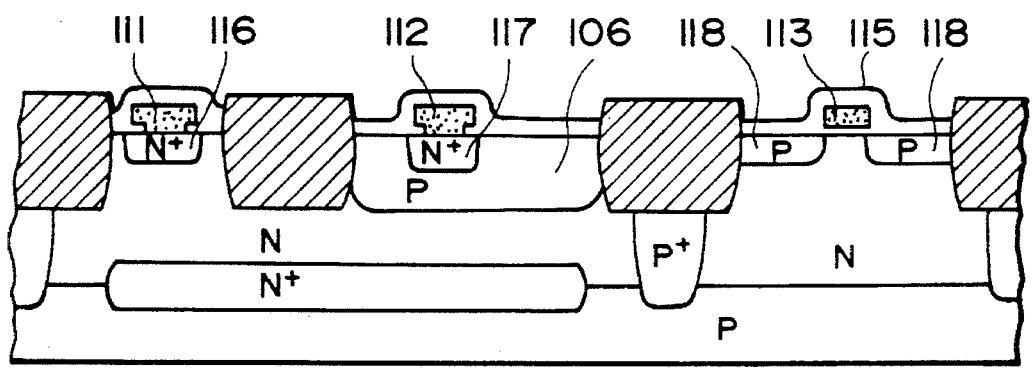

Then, as shown in FIG. 2C, thermal oxidation is conducted for 15 minutes at 1,000° C. to form a thermal oxide layer 115 of a thickness of ca. 2,000 Å on the polysilicon layers 111, 112, 113 and the oxide layer 107. Also said thermal process causes the impurities in the polysilicon layers 111, 112 to diffuse respectively into the N-epitaxial layer 104 and the P-base domain 106. Thereby forming an $N^+$-ohmic contact layer 116 constituting the collector domain and an $N^+$-emitter domain 117. Additionally said thermal process causes the impurities in the implanted domain 114 to diffuse, thereby forming a P-domain 118 of a low impurity concentration constituting a part of the source and drain domains.

Figure 2D:
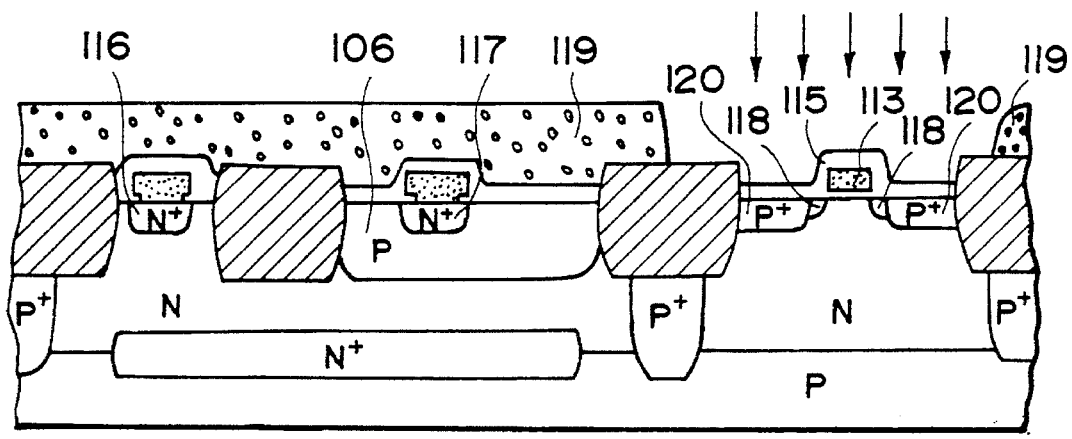
Figure 2E:
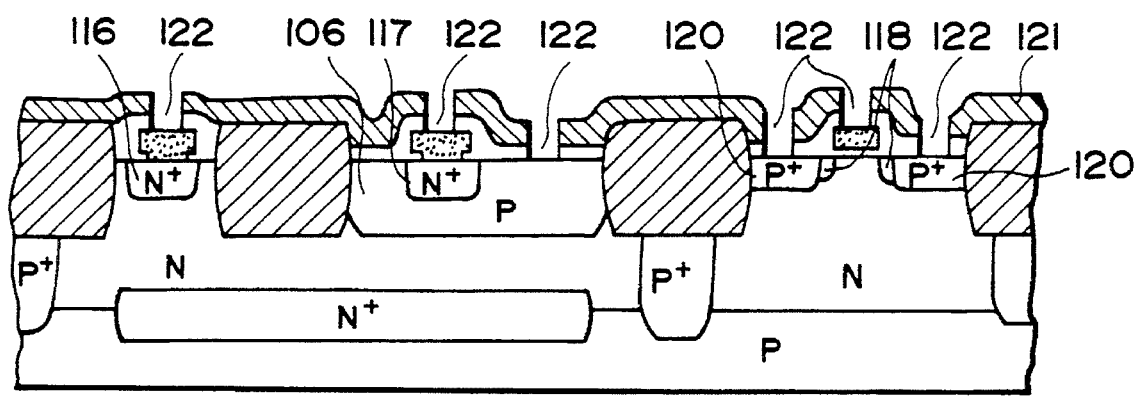

Then, as shown in FIG. 2D, a photoresist 119 is coated and is removed in an area corresponding to the MOS transistor. Implantation of borons is conducted at a high concentration, utilizing said resist 119, polysilicon layer 113 and a thermal oxide layer 115 at the side thereof as a mask. Subsequently as shown in FIG. 2E a PSG layer 121 of a thickness of 6,000 Å is formed by a CVD process. Thermal treatment is conducted at 950° C. to densify said PSG layer 121 and to activate the implanted impurity. Thereby forming a $P^+$-domain 120 constituting a part of the source and drain domains. Thus the source and drain domains are composed of the domain 120 of a high impurity concentration, and the P-domain 118 of a high impurity concentration and of a thickness corresponding to the thermal oxide layer 115 at the side of the polysilicon layer 113. Then contact holes 122 are formed by a photolithographic process on the polysilicon layer and the base, source and drain domains. As will be explained later, this etching process is completed almost simultaneously in all the areas, without extreme over or under-etching in any particular area.

In the following there will be given a more detailed explanation on the relation of the aforementioned thermal oxidation step and the etching step for forming the contact holes 122.

If the thickness of the oxide layer obtained by thermal oxidation varies from area to area, the pattern formation has to be conducted with plural photomasks because the etching process require different periods, so that the number of steps is inevitably increased.

For this reason there have been investigated a condition that allows to provide substantially the same thicknesses for the photoetching process.

In the first place, oxidation with dry $O_2$ requires an excessively long period for obtaining a desired thickness in the oxide layer, thus causing an excessive diffusion of the emitter domain and eventual punch-through of the base domain. On the other hand, wet oxidation at 900° C. requires about 60 minutes for forming an oxide layer of ca. 1,500 Å on the N-epitaxial layer 104 bearing the gate oxide layer 7 of 500 Å, and a thermal oxide layer 115 of ca. 3,000 Å is formed on the polysilicon layer 113 during said period. In such situation the etching time required for contact hole formation, with an etch rate of 600–700 Å/min. in the thermal oxide layer, is different, by more than 1 minute, between the polysilicon layer and other areas. Consequently, when the etching is completed on the polysilicon layer, considerable overetching will appear in other areas.

However the present inventors, based on a fact that the ratio of oxidation rate on a polysilicon layer and an oxide layer formed on a semiconductor varies with the temperature, have found a condition where substantially the same thicknesses can be obtained, thereby avoiding the above-described drawback. More specifically, the present inventors have experimentally confirmed that the difference in the oxidation rates is reduced at a higher temperature. Consequently, in an embodiment, wet oxidation at 1,000° C. is employed to develop an oxide layer of 1,500 Å within 15 minutes on the N-epitaxial layer 104 bearing the gate oxide layer 7 of 500 Å and an oxide layer 115 of ca. 2,000 Å within the same time on the polysilicon layer 113. In this manner the difference in thickness is reduced to ca. 500 Å. In addition, the etching process was completed almost at the same time, despite of a difference of 500 Å in thickness, since the thermal oxide layer on the polysilicon layer shows a faster etching rate due to the presence of a small amount of phosphor derived from the polysilicon layer. Consequently these layers can be ragarded as of a substantially same thickness for the purpose of photolithography.

In this manner the etching for contact hole formation can be conducted in one step, with sufficient precision. The thickness of the oxide layer is selected in a range of 1,500 to 2,000 Å because the offset between the thickness of the polysilicon layer and the MOS transistor is preferably equal at least to ca. 2,000 Å.

Thus a higher precision can be achieved since the emitter diffusing aperture 109 is formed by etching such thin gate oxide layer 107, and a shallow junction can be obtained by self alignment because the emitter domain 117 is formed by diffusion from the polysilicon layer 112. It is therefore rendered possible to reduce the alignment margin and to improve the performance of the bipolar transistor.

On the other hand, the MOS transistor exhibits improved performances because the electric field intensity is reduced by the presence of the P-domain 118 of the lower impurity concentration, formed by self alignment, thus suppressing the generation of hot carriers etc. Also the thermal oxide layer 115 at the side of the polysilicon layer 113 facilitates the formation of the P-domain 118.

However the above-mentioned concentration profile in the source and drain domains for suppressing the hot carrier generation need not necessarily be attained by two ion implantations explained above.

Figure 3:
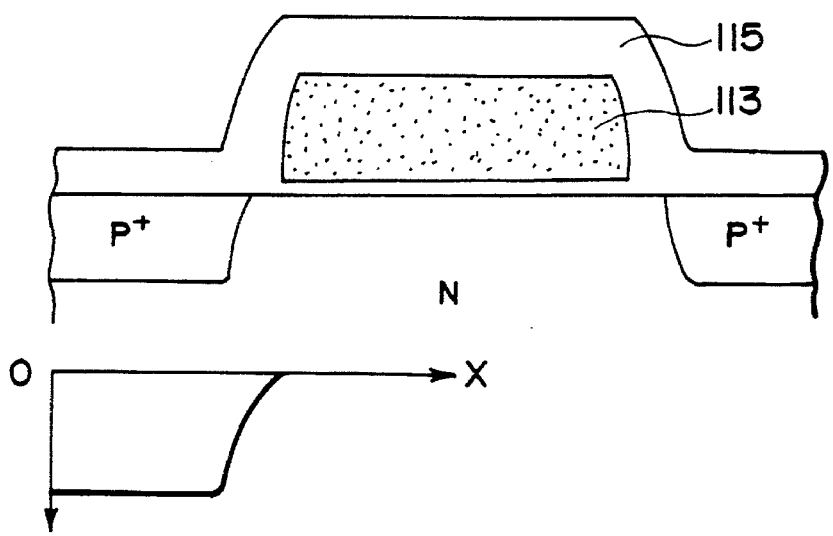
FIG. 3 is a schematic view of another process for obtaining a desired concentration profile.

FIG. 3 is a schematic view showing another process for obtaining a desired concentration profile.

The thermal oxide layer 115 formed on the polysilicon layer 113 is inevitably inclined. For this reason, in contrast to the case of utilizing the polysilicon layer 113 alone as the mask, a concentration profile as shown in the attached chart can be obtained with a single boron implantation. Also it is possible to obtain a desired concentration profile, capable of suppressing the generation of hot carriers, by an etch step for forming slanted side walls in the formation of the polysilicon layer 113.

In this manner it is rendered possible to simultaneously form a bipolar transistor and MOS transistor improved in performance, without complication in the manufacturing process and without any loss in the performance of the transistors.

Figure 4A:
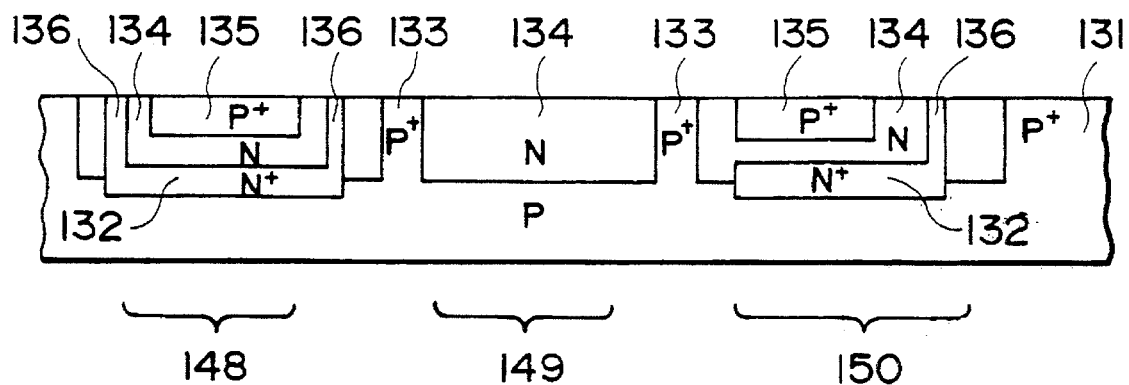
FIGS. 4A and 4B are views schematically showing a process for producing a photosensor, constituting a second embodiment of the present invention.
Figure 4B:
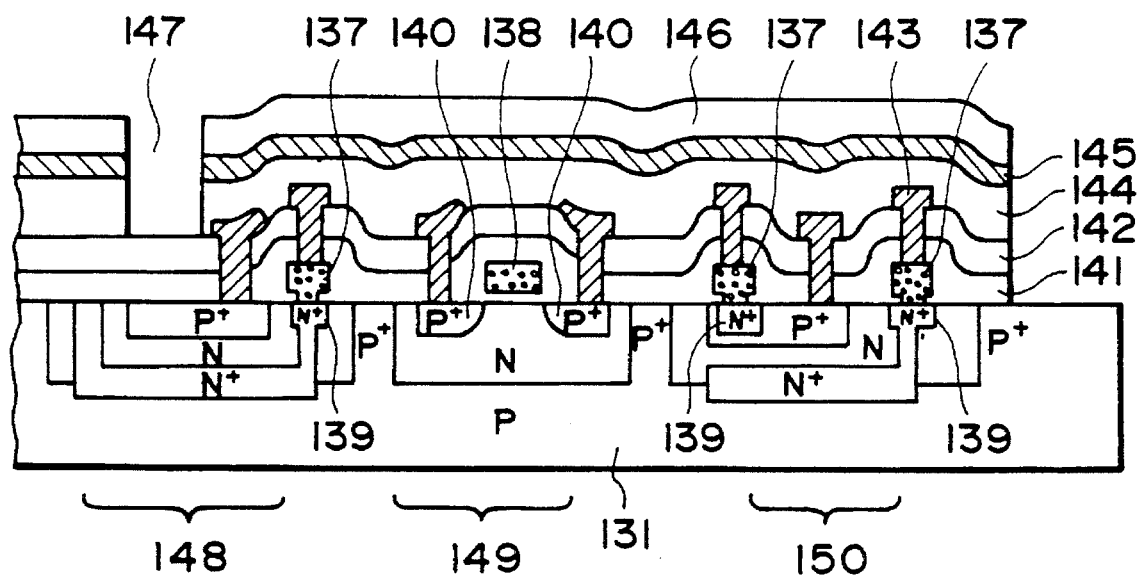

FIGS. 4A to 4B schematically illustrate a process for producing a photosensor constituting a second embodiment of the present invention.

In FIG. 4A there are shown a P-substrate 131, an $N^+$-embedded layer 132, a separating $P^+$-domain 133, an N-epitaxial layer 134, a $P^+$-domain 135, and a deep $N^+$-diffused domain 136.

In a photodiode area 148, the $P^+$-domain 135 forms a $P^+N$ junction with the N-epitaxial layer 134. The $N^+$-diffused domain 136 surrounds the photodiode in cooperation with the embedded layer 132, in order to prevent a parasitic transistor effect of the photodiode.

Figure 6:
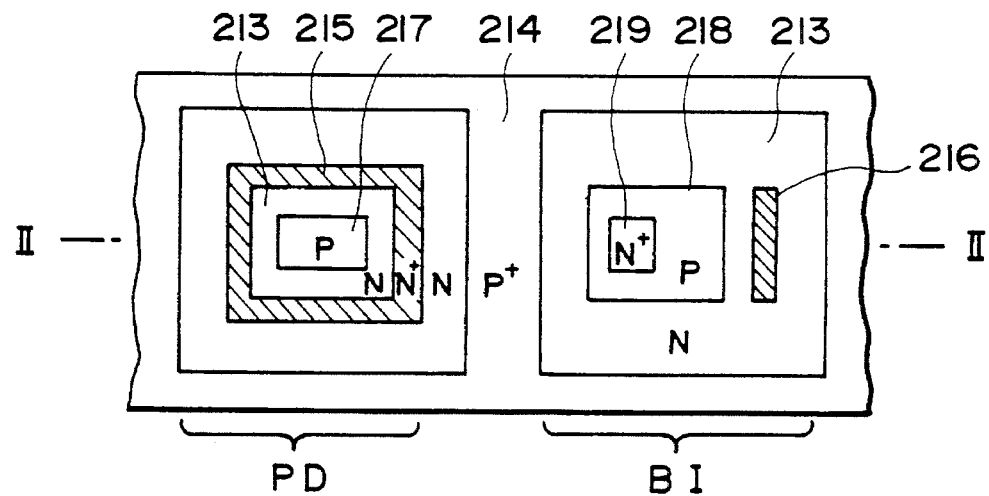
FIG. 6 is a schematic plan view of a photosensor produced according to said embodiment.

It is noted that, as shown in the cross-sectional view of FIG. 4 and the plan view of FIG. 6, since $N^+$-diffusion layer 136 is formed to enclose all of side surface of the photodiode section, the parasitic effect is significantly reduced. Therefore, such configuration of the $N^+$-diffusion layer 136 is advantageous. Also a bipolar transistor area 150 reduces the collector resistance.

Then, as shown in FIG. 4B, a polysilicon layer 137 containing an N-type impurity is formed on the diffusing aperture of the gate oxide layer. A gate electrode polysilicon layer 138 is formed on the gate oxide layer of the MOS transistor 149, in a similar manner as in the first embodiment.

Subsequently a thermal oxidation step is conducted to form a thermal oxide layer 141 of a thickness of ca. 1,500 Å and to diffuse impurity from the polysilicon layer thereby forming an $N^+$-domain 139 constituting the emitter domain and the ohmic contact domain. Then formed in succession are a PSG layer 142 of a thickness of 6,000 Å, an aluminum wiring 143, and a plasma nitride interlayer 144. Then a light shield layer 145 and a plasma nitride passivation layer 146 are formed. The nitride layers 144 and 146 are removed by plasma etching to form a light receiving window 147 on the photodiode 148.

Also in such photosensor, the present invention can be applied to integrate the bipolar transistor and the MOS transistor, thereby reducing the parasitic capacitance, enabling the processing of a very weak current from the photodiode in dark situations, and improving the reliability.

Because of the elimination of the plasma nitride layer, the light receiving window 147 of the photodiode has a thickness of ca. 7,500 Å which is equal to the sum of the thermal oxide layer 141 and the PSG layer 142, thus approximately satisfying the condition of antireflection for the central wavelength of the human visual sensitivity. In this manner the conversion efficiency for the incident light is improved, and the sensitivity is therefore improved.

The source and drain domains 140 of the MOS transistor 149 in the present embodiment may be formed with a desired concentration profile with two ion implantations, or with only one ion implantation as already explained in relation to FIG. 3.

As detailedly explained in the foregoing, the process of the present embodiment allows to simultaneously form a bipolar transistor and an gate-insulated transistor of improved performance without complicating the manufacturing process, and facilitates integration.

Figure 5A:
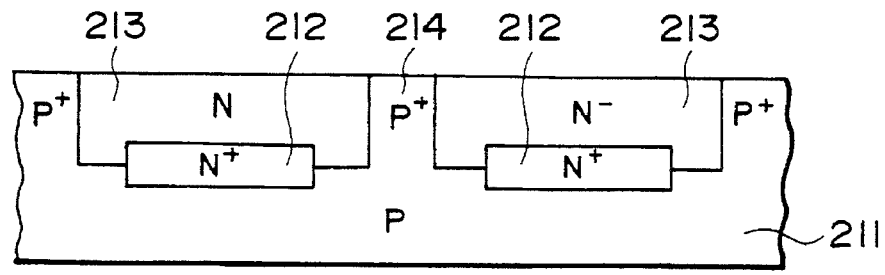
FIGS. 5A to 5C are views schematically showing a process for producing a photosensor of the present invention.
Figure 5B:
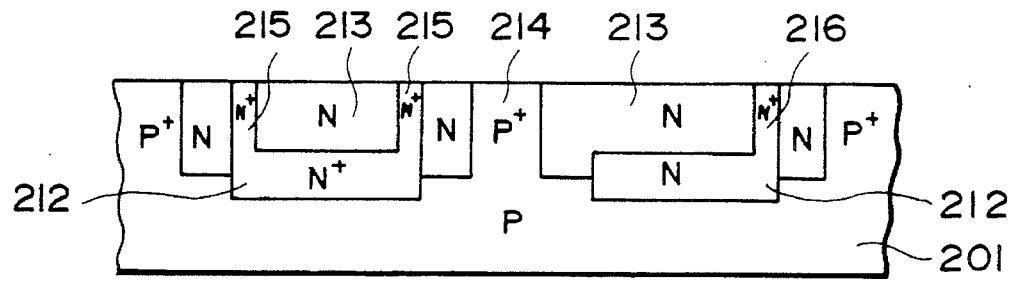
Figure 5C:
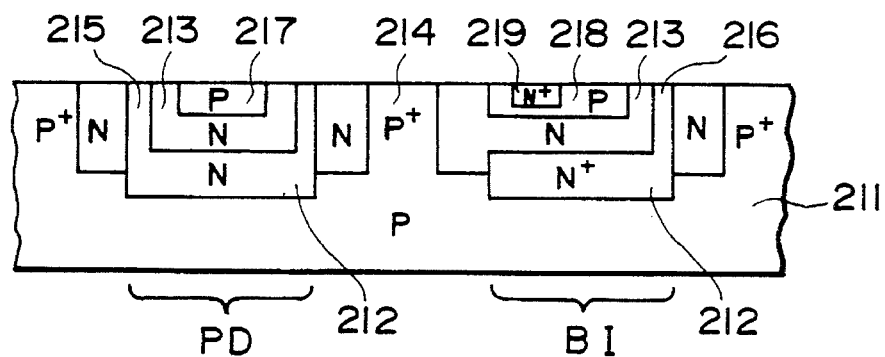

FIGS. 5A to 5C are schematic views showing a process for producing a photosensor, constituting a third embodiment of the present invention, while FIG. 6 is a schematic cross-sectional view of the photosensor produced in said embodiment, and FIG. 5C is a cross-sectional view along a line II—II in FIG. 6.

At first, as shown in FIG. 5A, an $N^+$-embedded layer 212 of a high impurity concentration is formed on a P-semiconductor substrate 211, and an N-epitaxial layer 213 is grown thereon. Subsequently a $P^+$-separating domain 214 is formed by boron diffusion, thus defining an island of epitaxial layer for forming a photodiode PD and a bipolar transistor BI.

Then, as shown in FIG. 5B, phosphor is diffused, for example by means of $POl_3$, with a concentration higher than of the N-epitaxial layer 213 to form a deep $N^+$-diffusion layer 215 reaching the embedded layer 212 and an $N^+$-diffusion layer 216 of the bipolar transistor.

Subsequently, as shown in FIG. 5C, a P-layer 217 is formed in the N-epitaxial layer 213 of the photodiode surrounded by the embedded layer 212 and the $N^+$-diffusion layer 215, thus forming a PN-junction. Simultaneously a P-base layer 218 in the N-epitaxial layer 213 constituting the collector of the bipolar transistor, and an $N^+$-layer 219 is formed as the emitter domain in the P-base layer 218.

The $N^+$-diffusion layer 215 of the photo-diode is completely surrounds the P-layer 217 as shown in FIG. 6.

In this manner there can be obtained a photosensor having a photodiode PD and a bipolar transistor BI as shown in FIG. 5C and FIG. 6.

In the present embodiment, the PN-junction of the photodiode PD is surrounded by the $N^+$-embedded layer 212. The $N^+$-diffusion layer 215 has an impurity concentration higher than that of the N-epitaxial layer 213, so that the parasitic effect, such as the parasitic transistor effect, is reduced between the $P^+$-separating area 214 and the P-semiconductor substrate 211, and satisfactory stable performance can be expected in the photosensor.

It is noted that, in order to obtain the above significant advantage is performance, it is necessary that the N-epitaxial layer 213 is covered at almost all of the bottom and side surfaces thereof by the $N^+$-diffusion layer 215 and the embedded layer 215 and the embedded layer 214. That is, in case that $N^+$ layer is provided only at a portion of the bottom and side wall as described in the Related Background Art, practically sufficient reduction in parasitic effect can not be obtained.

Also in the present embodiment, the collector resistance of the bipolar transistor BI is reduced since the $N^+$-diffusion layer 216 reaches the $N^+$-embedded layer 212.

The photosensor of the present invention is not limited to the above-explained embodiment, but may include plural bipolar transistors and plural field effect transistors on a same substrate.

As detailedly explained in the foregoing, the present embodiment allows to significantly reduce the parasite effect and to stabilize the performance of a photosensor, by completely surrounding the photodiode with a semiconductor domain of a conductive type opposite to that of the semiconductor substrate and of a high impurity concentration.

Also the process of the present embodiment allows to easily produce a photodiode surrounded by a semiconductor domain of a conductive type opposite to that of the semiconductor substrate and of a high impurity concentration, by means of an ordinary process for producing bipolar transistors. Therefore, if a bipolar transistor is included in the semiconductor device, said bipolar transistor and the photodiode can be prepared through substantially same process steps, so that the entire number of process steps can be reduced.

What is claimed is:

1. A photosensor comprising, in a semiconductor substrate of a first conductivity type, a photodiode composed of a semiconductor domain of a conductivity type opposite of the first conductivity type, all of a lower surface and sides of said photodiode being surrounded by a semiconductor domain of the conductivity type opposite of the first conductivity type and of a high impurity concentration, and a semiconductor domain of the first conductivity type forming a junction with said semiconductor domain of the conductivity type opposite of the first conductivity type, wherein said photodiode is separated from other semiconductor elements by a separating domain composed of a semiconductor of the first conductivity type, wherein said other semiconductor elements include a transistor adjacent to said photodiode, with said transistor comprising a buried region and a diffusion region extending from a surface of said substrate to the buried region, and the diffusion region being arranged at one side of a base region, with said photodiode being arranged at the opposite side of said base region.

2. A semiconductor device comprising:

a semiconductor substrate of a first conductivity type, a photoelectric conversion element provided thereon, and a transistor for processing a signal from said photoelectric conversion element, wherein said photoelectric conversion element has a first region of the first conductivity type, a second region of a second, opposite conductivity type surrounding said first region, and a third region of the second conductivity type and having an impurity concentration greater than that of said second region, said third region surrounding all of sides and a lower surface of said second region, wherein said transistor is adjacent to a photoelectric conversion element, and comprises a buried region and a diffusion region extending from a surface of said substrate to said buried region, the diffusion region being arranged at one side of a base region, with the photoelectric conversion element being arranged at the opposite side of said base region.

3. A semiconductor device according to claim 2, wherein said transistor is a MOS transistor.

4. A semiconductor device according to claim 2, wherein said transistor is a bipolar transistor.

5. A semiconductor device according to claim 2, wherein said transistor is optically shielded by a light shielding layer provided thereon.

6. A semiconductor device according to claim 2, wherein said third region comprises a buried layer provided on said semiconductor substrate and under said second region, and a sub-region surrounding all of said sides of said second region.

7. A semiconductor device according to claim 6, wherein an electric contact is provided on a part of said sub-region.

8. A semiconductor device according to claim 7, wherein said electric contact is optically shielded by a light shielding layer provided thereon.

* * * * *

UNITED STATES PATENT AND TRADEMARK OFFICE
CERTIFICATE OF CORRECTION

PATENT NO. : 5,488,251
DATED : January 30, 1996
INVENTOR(S) : HIDEMASA MIZUTANI ET AL.          Page 1 of 3

It is certified that error appears in the above-identified patent and that said Letters Patent is hereby corrected as shown below:

Title page:
AT [56] REFERENCES CITED

Foreign Patent Documents,
"3425908  8/1983  Germany" should read
--3425908  3/1985  Germany--.

AT [57] ABSTRACT

Line 8, "domains" should read --domain--.

In the Drawings:
SHEET 1 OF 5

Figure 1A:
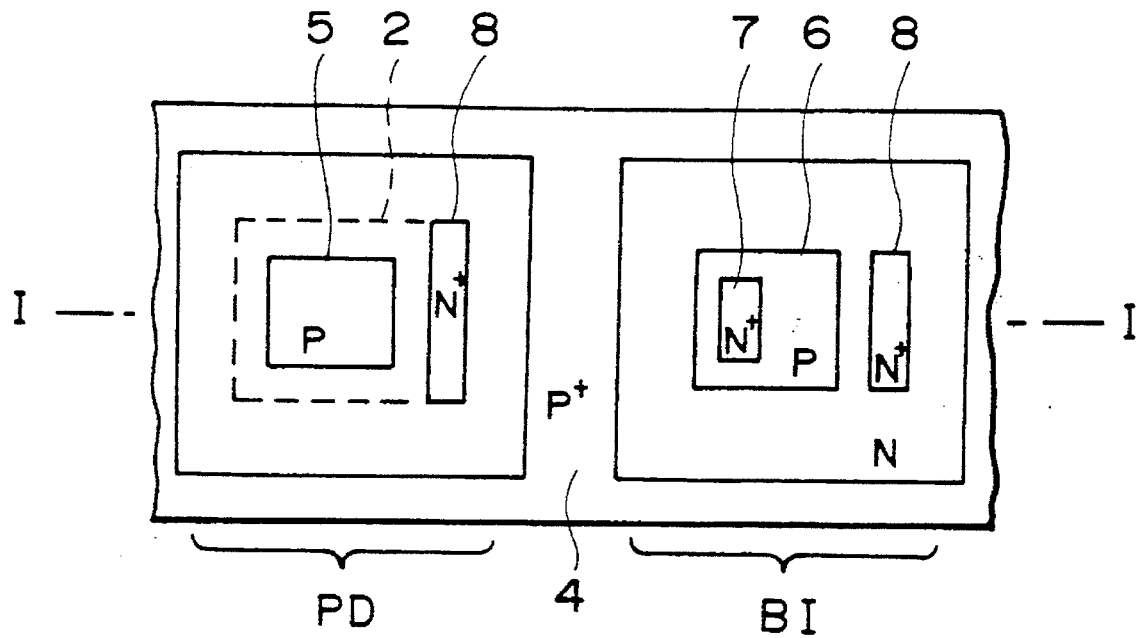
FIG. 1A is a schematic plan view of a conventional photosensor.
Figure 1B:
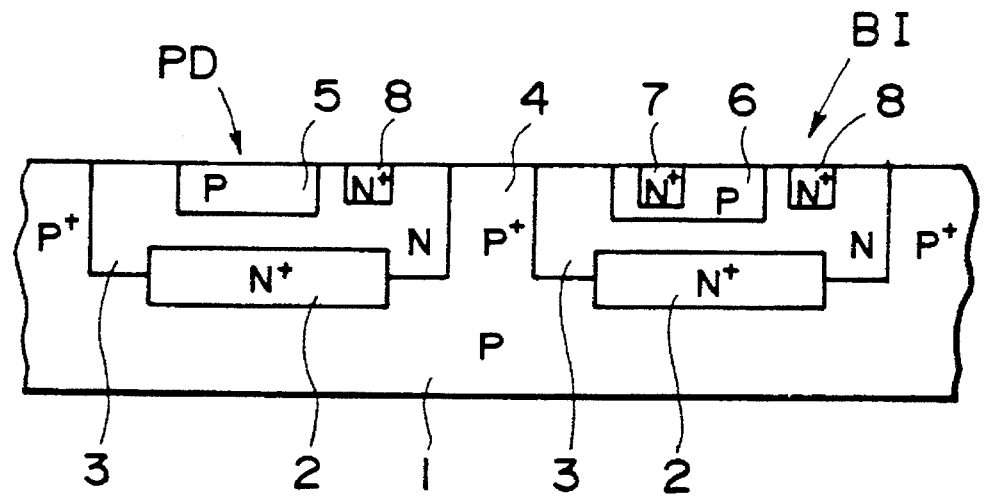
FIGS. 1B is a cross-sectional view along a line I—I in FIG. 1A.

FIG. 1, insert --PRIOR ART--.
FIG. 2, insert --PRIOR ART--.

SHEET 5 OF 5

FIG. 5C, "N" (in box 215) should read --$N^+$--.

COLUMN 1

Line 18, "relate" should read --relates--.
Line 39, "However" should read --However,--.

COLUMN 2

Line 4, "However" should read --However,--.

UNITED STATES PATENT AND TRADEMARK OFFICE
CERTIFICATE OF CORRECTION

PATENT NO. : 5,488,251
DATED : January 30, 1996
INVENTOR(S) : HIDEMASA MIZUTANI ET AL.         Page 2 of 3

It is certified that error appears in the above-identified patent and that said Letters Patent is hereby corrected as shown below:

COLUMN 3

Line 26, "Also" should read --Also,--.
Line 31, "Additionally" should read --Additionally,--.
Line 40, "Subsequently" should read --Subsequently,--.
Line 55, "following" should read --following,--.
Line 62, "require" should read --requires--.

COLUMN 4

Line 3, ",oxide" should read --oxide--.
Line 34, "quently" should read --quently,--.
Line 43, "Thus" should read --Thus,--.
Line 54, "Also" should read --Also,--.
Line 57, "However" should read --However,--.

COLUMN 5

Line 36, "Subsequently" should read --Subsequently,--.
Line 38, "layer" should read --layer,--.

UNITED STATES PATENT AND TRADEMARK OFFICE
CERTIFICATE OF CORRECTION

PATENT NO.  : 5,488,251
DATED       : January 30, 1996
INVENTOR(S) : HIDEMASA MIZUTANI ET AL.    Page 3 of 3

It is certified that error appears in the above-identified patent and that said Letters Patent is hereby corrected as shown below:

COLUMN 6

```
Line 1,  "an" should read --a--.
Line 24, "Simultaneously" should read
          --Simultaneously,--.
Line 28, "is" should be deleted.
Line 30, "manner" should read --manner,--.
Line 43, "is" (first occurrence) should read --in--.
Line 49, "can not" should read --cannot--.
Line 60, "parasite" should read --parasitic--.
```

Signed and Sealed this

Thirtieth Day of July, 1996

Attest:

BRUCE LEHMAN

*Attesting Officer*    *Commissioner of Patents and Trademarks*